(12) United States Patent
Shin

(10) Patent No.: US 7,636,075 B2
(45) Date of Patent: *Dec. 22, 2009

(54) CURRENT SAMPLE AND HOLD CIRCUIT AND METHOD AND DEMULTIPLEXER AND DISPLAY DEVICE USING THE SAME

(75) Inventor: Dong-Yong Shin, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 808 days.

This patent is subject to a terminal disclaimer.

(21) Appl. No.: 10/954,804

(22) Filed: Sep. 29, 2004

(65) Prior Publication Data

US 2005/0073488 A1 Apr. 7, 2005

(30) Foreign Application Priority Data

Oct. 7, 2003 (KR) .......................... 2003-0069646

(51) Int. Cl.
G09G 3/30 (2006.01)
H03K 5/00 (2006.01)
(52) U.S. Cl. ........................ 345/77; 345/100; 327/91
(58) Field of Classification Search ............. 345/76–82, 345/98–100
See application file for complete search history.

(56) References Cited

U.S. PATENT DOCUMENTS

| | | | |
|---|---|---|---|
| 5,376,841 A * | 12/1994 | Itakura et al. ................. | 327/94 |
| 5,410,269 A * | 4/1995 | Ohie et al. .................... | 327/91 |
| 6,181,314 B1 * | 1/2001 | Nakajima et al. ........... | 345/100 |
| 6,333,729 B1 | 12/2001 | Ha | |
| 6,847,346 B2 | 1/2005 | Kumagai et al. | |
| 6,927,618 B2 * | 8/2005 | Kimura et al. .............. | 327/427 |
| 7,030,844 B2 | 4/2006 | Kang et al. | |
| 7,057,589 B2 | 6/2006 | Shin et al. | |
| 7,205,972 B1 | 4/2007 | Kyeong et al. | |
| 7,268,717 B2 * | 9/2007 | Baek .......................... | 341/144 |
| 7,317,441 B2 * | 1/2008 | Tobita ........................ | 345/100 |

FOREIGN PATENT DOCUMENTS

| | | |
|---|---|---|
| JP | 2000-039926 | 2/2000 |
| WO | WO 98/11554 | 3/1998 |

OTHER PUBLICATIONS

Patent Abstracts of Japan for Publication No. 2000-039926; Date of publication of application Feb. 8, 2000, in the name of Shirai Eiji.
Renyuan Huang and Chin-Long Wey, Design of High-Speed High-Accuracy Current Copiers for Low-Voltage Analog Signal Processing Applications, IEEE Transactions on Circuits and Systems-II: Analog and Digital Signal Processing, vol. 43, No. 12, pp. 836-839, Dec. 1996.

* cited by examiner

*Primary Examiner*—Duc Q Dinh
(74) *Attorney, Agent, or Firm*—Christie, Parker & Hale, LLP

(57) ABSTRACT

A data current sample and hold circuit having an input terminal of a current source type and an output terminal of a current sink type. The sample and hold circuit includes a first transistor, a capacitor, and a plurality of switches, for sampling and holding the data current sunk to an output terminal of a data driver. When the sampled and held data current is applied to the data line, the data current is sunk to an output terminal of the sample and hold circuit. The sample and hold circuit is used together with a data driver having an output terminal of the current sink type.

14 Claims, 11 Drawing Sheets

CURRENT SAMPLE AND HOLD CIRCUIT AND METHOD AND DEMULTIPLEXER AND DISPLAY DEVICE USING THE SAME

CROSS REFERENCE TO RELATED APPLICATION

This application claims priority to and the benefit of Korea Patent Application No. 2003-69646 filed on Oct. 7, 2003 in the Korean Intellectual Property Office, the entire content of which is incorporated herein by reference.

BACKGROUND OF THE INVENTION (a) Field of the Invention

The present invention relates to a current sample-and-hold circuit. More specifically, the present invention relates to a current sample-and-hold circuit for demultiplexing data current in a current driven display device.

(b) Description of the Related Art

FIG. 1 shows an AMOLED (active matrix organic light emitting diode) display device as an example of a current driven display device which requires current demultiplexing. Exemplary embodiments of the present invention can be applied to the AMOLED display device of FIG. 1, as well as other suitable current driven display devices.

The current driven display device of FIG. 1 includes a data driver 10 for supplying the data current, a demultiplexer 20 for demultiplexing the data current by a ratio of 1:N, and scan drivers 31 and 32 for sequentially selecting select lines of a pixel 40 on a predetermined row.

The pixel 40 belonging to the line selected by the scan drivers 31 and 32 receives a predetermined data current, and represents a color which corresponds to the data current. In the current driven display device of FIG. 1, a current demultiplexer 20 for reducing the number of the data drivers 10 is used. That is, the current provided by the data driver 10 is demultiplexed by 1:N by the demultiplexer 20 to thus supply data to the pixels which correspond to N data lines 50. The number of required data drivers is reduced by using the demultiplexer 20, thereby reducing purchase costs.

FIG. 2 shows an analog switch used for a conventional demultiplexer.

In the 1:2 demultiplexer of FIG. 2, the data current is output to two data lines as switches S1 and S2 are alternately turned on and off. In order to realize high resolution in a current driven panel, a long time is required to write the data on the pixel 40. However, since the data is to be written on the pixel each time the switches are switched, the data writing time needs to be reduced when reducing the number of the data drivers.

Therefore, it is difficult to realize high resolution using a conventional demultiplexer. This difficulty is addressed by configuring the demultiplexer using a sample-and-hold circuit.

FIG. 3 shows a conventional sample-and-hold circuit 120.

A pixel circuit of the conventional AMOLED has an input terminal and an output terminal in the form of a current source. Therefore, the output terminal of the sample-and-hold circuit 120 should be in the form of a current sink since the input terminal of a pixel 140 is coupled in the current source format to an external device.

Since the conventional pixel circuit stores current programmed data and writes the same on the pixels, the pixel circuit performs a similar function of the sample-and-hold operation.

In the case of using the conventional pixel circuit as a sample-and-hold circuit, both of the input terminal and the output terminal of the sample-and-hold circuit 120 are implemented in the source format or the sink format.

Hence, the conventional sample-and-hold circuit to be used with the pixel 140 having the input terminal in the source format has the output terminal in the current sink format, and in this instance, the input terminal of the sample-and-hold circuit is also in the current sink format and coupled to a data driver IC 110 having an output terminal in the current source format.

Accordingly, as shown in FIG. 3, in the case of using the conventional sample-and-hold circuit 120, the output terminal of the data driver IC 110 has a current source format. However, the driver ICs having the output terminals in the current sink format have less production costs compared to the driver ICs having the output terminals in the current source format. Also, the driver ICs having the output terminals in the current sink format have further universal purposes since they can be directly coupled to the pixels configured in the current source format. In addition, the driver ICs having the output terminals in the current sink format expend less power, occupy less areas, and generate substantially uniform outputs.

However, in the case of using the sample-and-hold circuit 120 in the current driven display device which has the same operational conditions as those of the AMOLED, the advantages of the driver ICs having the output terminals in the current sink format are lost.

SUMMARY OF THE INVENTION

It is an aspect of the present invention to provide a demultiplexer for reducing the number of data drivers in a driver IC without reducing the data writing time.

It is another aspect of the present invention to provide a sample-and-hold circuit to be used together with a driver IC having a current sink output terminal.

It is still another aspect of the present invention to provide a sample-and-hold circuit with an input terminal and an output terminal in different current source/sink formats, and a display device using the same.

In an exemplary embodiment according to the present invention, a sample and hold circuit for sampling and holding a current corresponding to data is provided. The sample and hold circuit includes a first transistor and a first switch coupled to the first transistor so that the first transistor can be diode-connected in response to a first control signal applied to the first switch. A capacitor is coupled to the first transistor so that a source-gate voltage of the first transistor can be charged in the capacitor in response to the first control signal. The sample and hold circuit also includes a second switch for inputting the data to a drain of the first transistor in response to the first control signal, and a third switch for outputting the data from a source of the first transistor in response to a second control signal using the source-gate voltage charged in the capacitor.

The sample and hold circuit may further include a fourth switch for coupling the source of the first transistor to a first power source in response to a third control signal, and a fifth switch for coupling the drain of the first transistor to a second power source in response to a fourth control signal.

The first transistor may be a PMOS transistor, and the first power source may have a voltage higher than that of the second power source.

In another exemplary embodiment of the present invention, a method for sampling and holding a current is provided. The method includes: (a) diode-connecting a first transistor, and allowing an input current to flow to a first power source from a drain of the first transistor through the first transistor; (b) charging a source-gate voltage which corresponds to the input current in a capacitor coupled between a source and a gate of the first transistor; and (c) allowing an output current which corresponds to the source-gate voltage charged in the capacitor to flow to the source of the first transistor from a second power source through the first transistor.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

In the following detailed description, only certain exemplary embodiments of the present invention are shown and described, simply by way of illustration. As those skilled in the art would realize, the described embodiments may be modified in various different ways, all without departing from the spirit or scope of the present invention. Accordingly, the drawings and description are to be regarded as illustrative in nature, and not restrictive.

In exemplary embodiments according to the present invention, a sample-and-hold circuit is used to realize a demultiplexer. The sample-and-hold circuit has an input terminal in the current source format and an output terminal in the current sink format.

Figure 1:
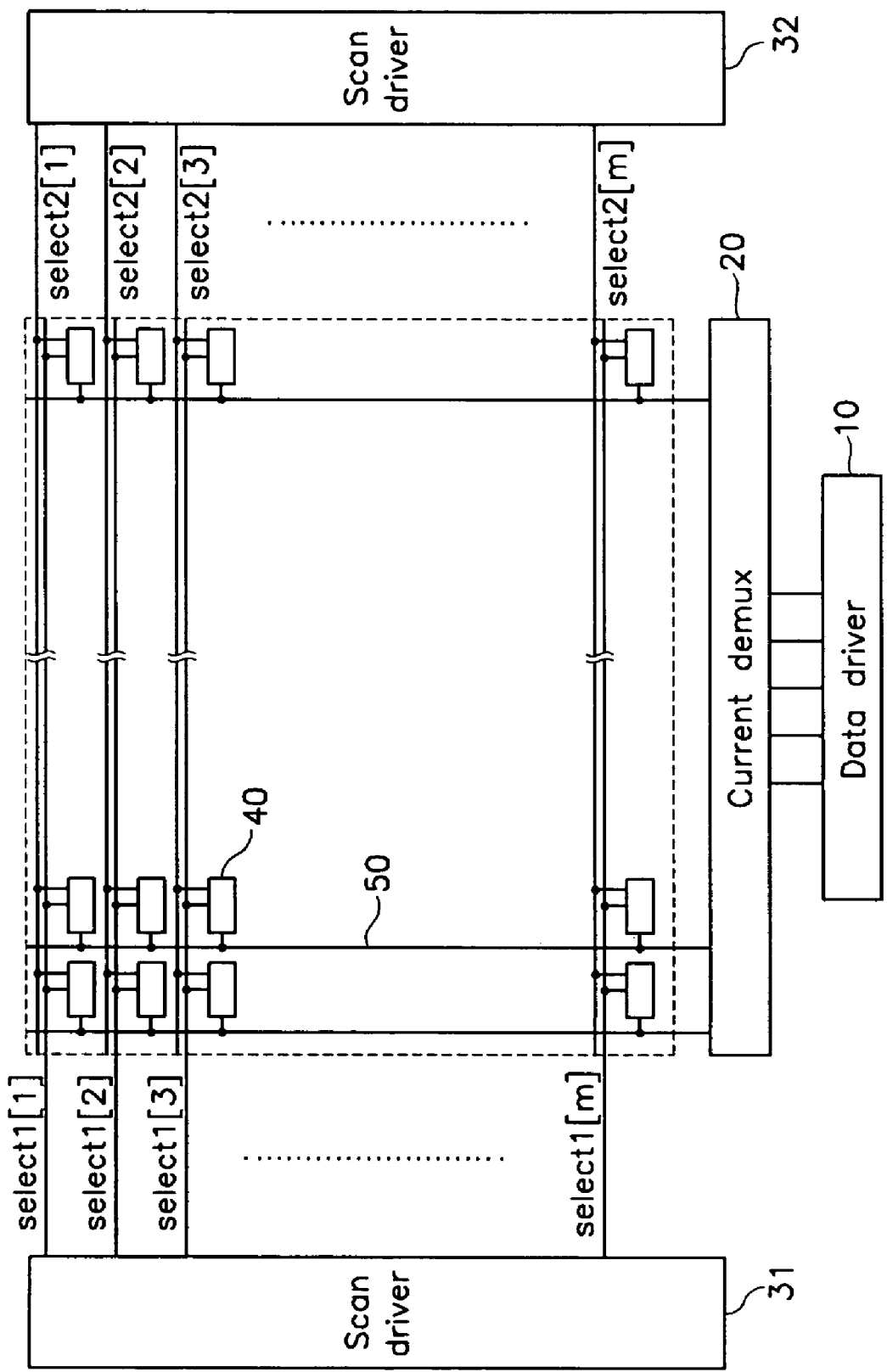
FIG. 1 shows an AMOLED (active matrix organic light emitting diode) display device as an example of a current driven display device which requires current demultiplexing, to which exemplary embodiments of the present invention can be applied.
Figure 2:
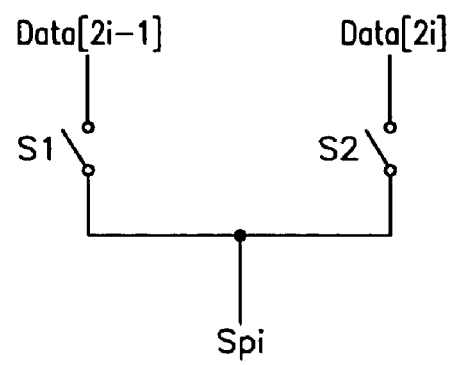
FIG. 2 shows an analog switch used for a conventional demultiplexer.
Figure 3:
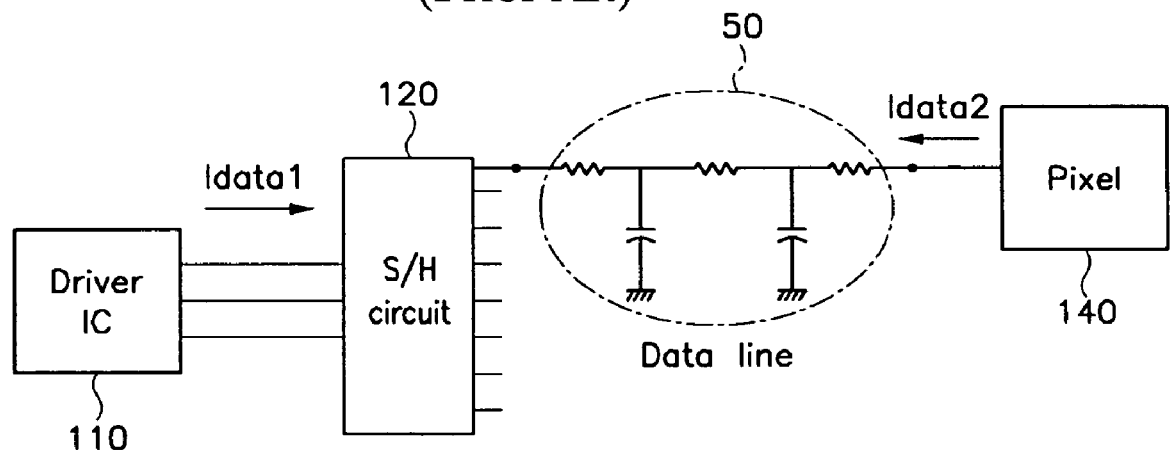
FIG. 3 shows a conventional sample-and-hold circuit.
Figure 4A:
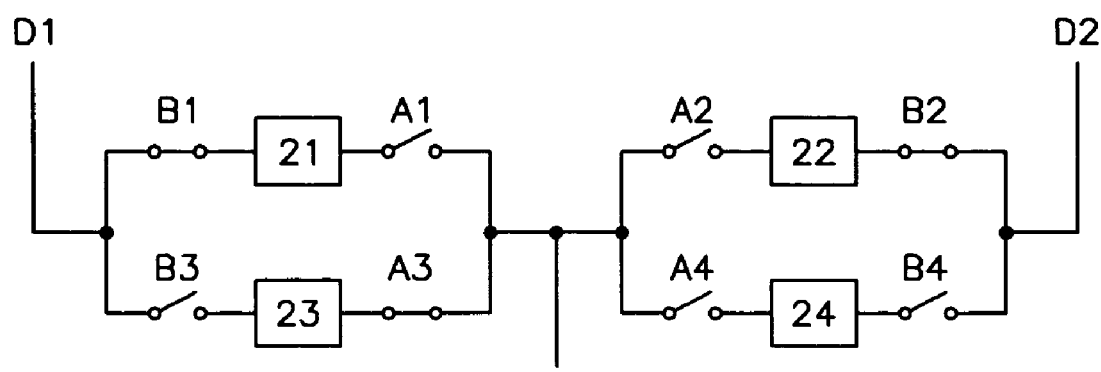
FIGS. 4A to 4D show demultiplexing operations using a sample-and-hold circuit.
Figure 4B:
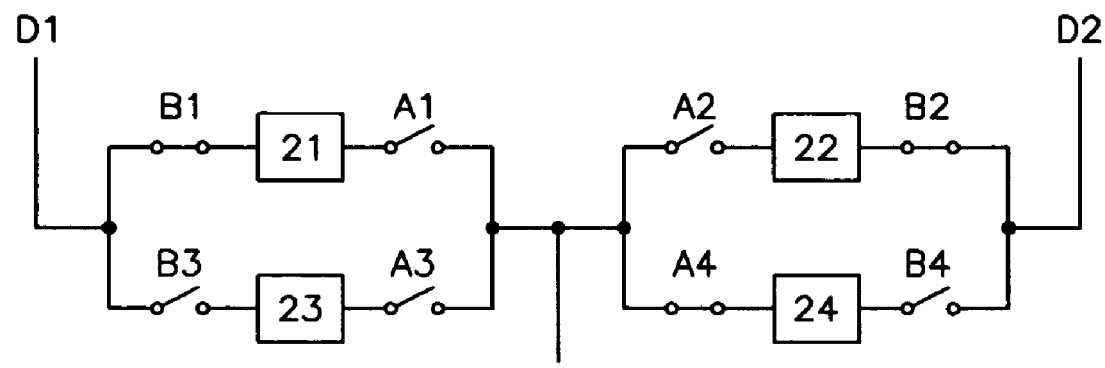
Figure 4C:
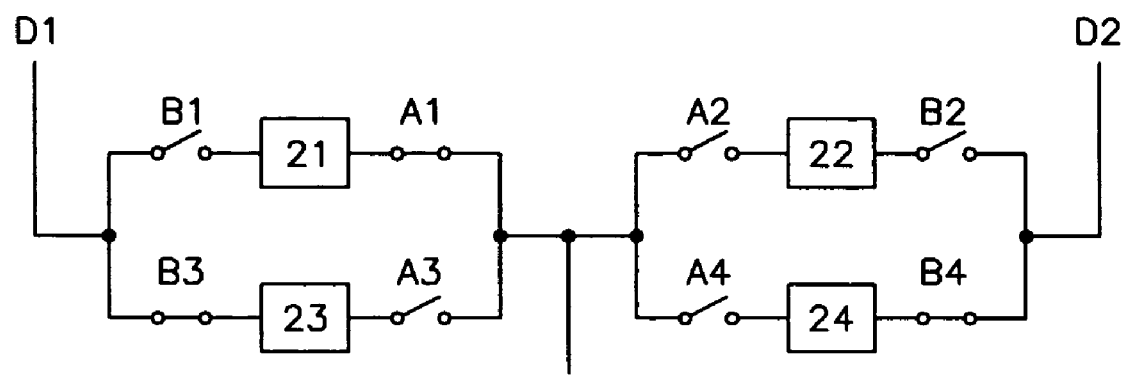
Figure 4D:
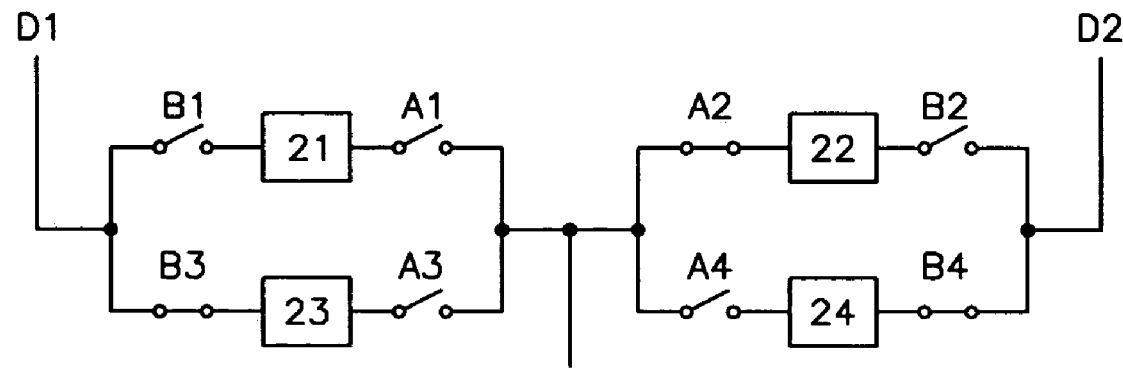

FIGS. 4A and 4B show a demultiplexing operation in the case of selecting an odd select line, and FIGS. 4C and 4D show a demultiplexing operation in the case of selecting an even select line.

The demultiplexers shown in FIGS. 4A to 4D use four sample-and-hold circuits which include data storage units 21, 22, 23, and 24, input switches A1, A2, A3, and A4, and output switches B1, B2, B3, and B4. Each sample-and-hold circuit samples the current flowing through an input terminal and records the sampled current in a voltage form in the data storage unit when an input switch is turned on, and holds the current which corresponds to the recorded data through an output terminal when an output switch is turned on. A demultiplexing operation using a sample-and-hold circuit will now be described with reference to FIGS. 4A to 4D.

In FIG. 4A, the input switches A1 and A2 are turned off (i.e., opened) and the output switches B1 and B2 are turned on (i.e., closed), such that the data storage units 21 and 22 supply the current caused by the previously sampled and stored data to data lines D1 and D2, respectively, and write the data on the pixels of the selected odd select line. The input switch A3 is turned on and the output switch B3 is turned off, such that the data storage unit 23 performs a sampling operation. Further, the data storage unit 24 with the turned-off input switch A4 and output switch B4 stays in a standby mode.

In FIG. 4B, since the input switches A1 and A2 are turned off and the output switches B1 and B2 are turned on, the data storage units 21 and 22 respectively supply the current to data lines D1 and D2 continuously. Since the input switch A3 is turned off while the output switch B3 remains turned off, the data storage unit 23 enters the standby mode to maintain the sampled and stored data. Also, since the input switch A4 is turned on while the output switch B4 remains turned off, the data storage unit 24 performs the sampling operation.

As can be seen in FIG. 4C, when the sampling operation by the data storage units 23 and 24 is finished, the input switch A3 remains turned off, the input switch A4 is turned off, and the output switches B3 and B4 are turned on, such that the data storage units 23 and 24 respectively supply the current caused by the sampled and stored data to the data lines D1 and D2. Therefore, the data is written on the pixels of the selected even select line. Further, the output switches B1 and B2 are turned off, the input switch A2 remains turned off, and the input switch A1 is turned on, such that the data storage unit 21 performs the sampling operation.

In FIG. 4D, the output switches B3 and B4 remain turned on while the input switches A3 and A4 remain turned off, and the data writing operation is performed. The input switch A1 is turned off while the output switch B1 remains turned off to allow the data storage unit 21 to be in the standby mode. Further, the input switch A2 is turned on while the output switch B2 remains turned off, such that the data storage unit 22 performs the sampling operation.

Therefore, the data current to be supplied to the data lines D1 and D2 are substantially uniformly sampled and held by the demultiplexing method shown in FIGS. 4A to 4D, during which the time for writing data on the pixels which corresponds to the odd or even select line can be reserved. Accordingly, there is no need to reduce the data writing time when performing the demultiplexing operation. The 1:2 demultiplexer as described above is a special case of a 1:N demultiplexer where N=2 as those skilled in the art would recognize.

The sample-and-hold circuits of FIGS. 4A to 4D may be considered as being grouped to two groups (i.e., N=2) that have input terminals that are coupled to each other and independent output terminals. By way of example, the sample and hold circuits including the data storage units 21 and 23 are in the first group and sample and hold circuits including the data storage units 22 and 24 are in the second group. It can be seen that input terminals of the sample and hold circuits are coupled to each other, and output terminals of the sample and hold circuits are coupled to each other in each group.

As shown in FIGS. 4A-4D, the sample-and-hold operation for each of the data storage units 21-24 includes: 1) an operation for sampling the current flowing through the input terminal and recording the sampled current in a voltage form in the data storage unit; 2) a state where the input switch and the output switch are turned off, the recorded data is maintained, thereby performing the standby mode; and 3) an operation for holding the current through the data line with a value corresponding to the recorded data. The above-noted stages may be referred to as a "sampling" stage, a "standby" stage, and a "holding" stage, respectively, in order to clarify the stages.

The configuration of the circuit for performing the described sample-and-hold operation will now be described in further detail.

Figure 5A:
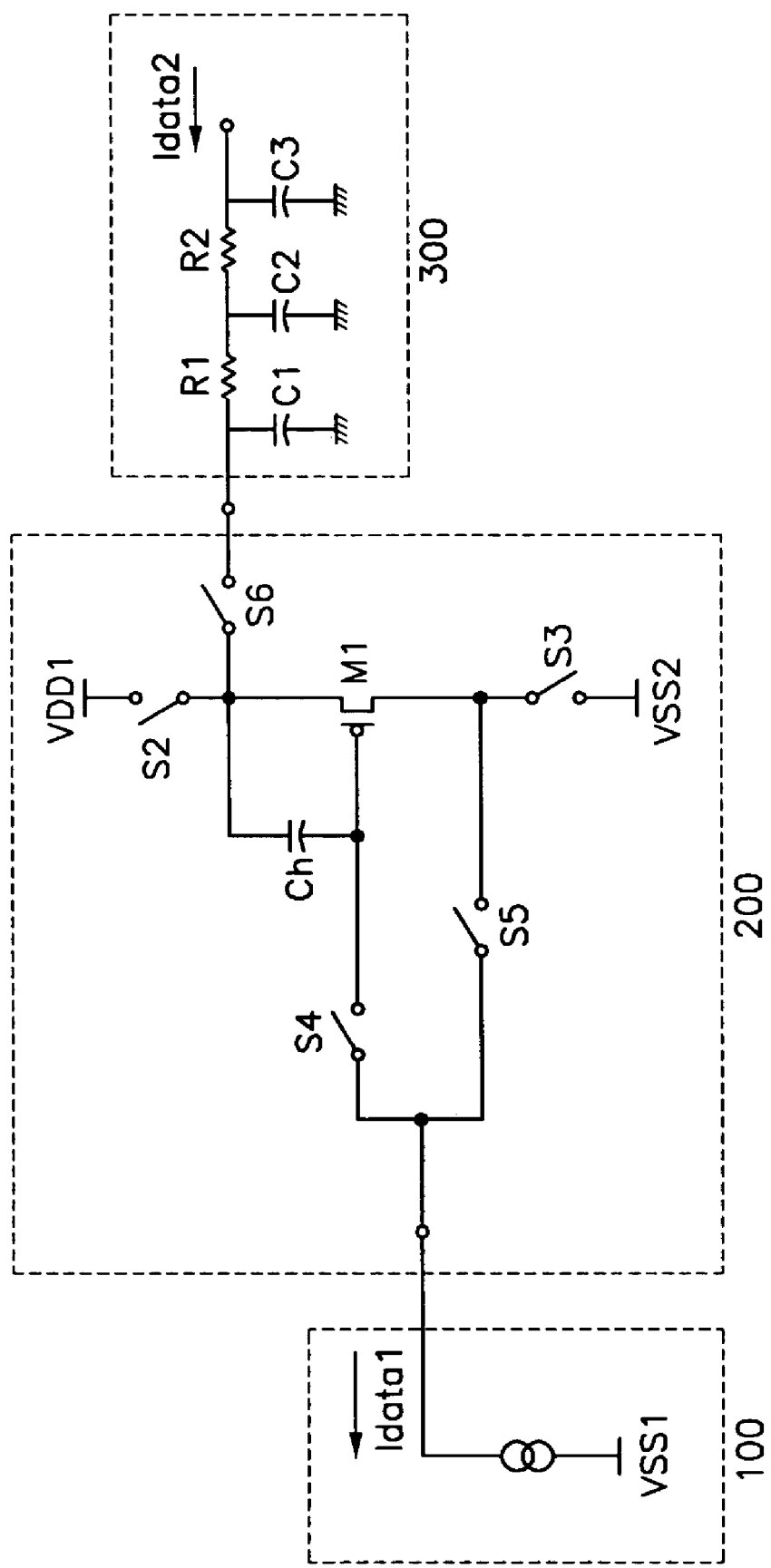
FIG. 5A shows a sample-and-hold circuit according to a first exemplary embodiment of the present invention.

FIG. 5A shows a sample-and-hold circuit 200 coupled to a data driver 100 and a data line 300 having parasitic resistors R1 and R2 and parasitic capacitors C1, C2, and C3. The sample-and-hold circuit 200 includes a transistor M1, a plurality of switches S2, S3, S4, S5, and S6, and a capacitor Ch. A PMOS transistor or an NMOS transistor may be used as one or more of the switches S1 to S5.

The switch S2 is coupled between a first power source VDD1 and a source of the transistor M1, and the switch S3 is coupled between a second power source VSS2 and a drain of the transistor M1. In the sample-and-hold circuit 200 of FIG. 5A, the transistor M1 is a PMOS transistor, and the first power source VDD1 has a voltage level higher than the voltage level of the second power source VSS2. In other embodiments, however, the sample-and hold circuit may have a different configuration.

The switch S4 is coupled between an input terminal and a gate of the transistor M1, and the switch S5 is coupled between the input terminal and the drain of the transistor M1. When the switches S4 and S5 are turned on, the transistor M1 is diode-connected. The switch S6 is coupled between the source of the transistor M1 and an output terminal.

An operation of the sample-and-hold circuit 200 according to the first exemplary embodiment will now be described.

When the switches S2, S4, and S5 are turned on, and the switches S3 and S6 are turned off, the gate and the drain of the transistor M1 are coupled to thereby configure a diode connection, and the current flows from the first power source VDD1 to the data driver 100 through the transistor M1. Further, the capacitor Ch is charged with a source-gate voltage which corresponds to the current flowing through the transistor M1. The sample-and-hold circuit 200 samples the data through the above-described method.

When the switches S2, S3, S4, S5, and S6 are turned off, the sample-and-hold circuit enters the standby mode. The standby mode is a state where the sample-and-hold circuit waits while another sample-and-hold circuit of the demultiplexer samples data.

When the switches S2, S4, S5 are turned off and the switches S3 and S6 are turned on, the current which corresponds to the source-gate voltage charged in the capacitor Ch is maintained through the output terminal. In this instance, the sample-and-hold circuit 200 performs a holding operation and outputs data.

The input terminal of the sample-and-hold circuit 200 sources the data current to the output terminal of the data driver 100 during the sampling operation. Also, the output terminal of the sample-and-hold circuit sinks the data current from the data line during the holding operation. Therefore, the sample-and-hold circuit 200 having the input terminal of the current source type and the output terminal of the current sink type is realized, and it can be used together with the data driver having the output terminal of the current sink type.

Figure 5B:
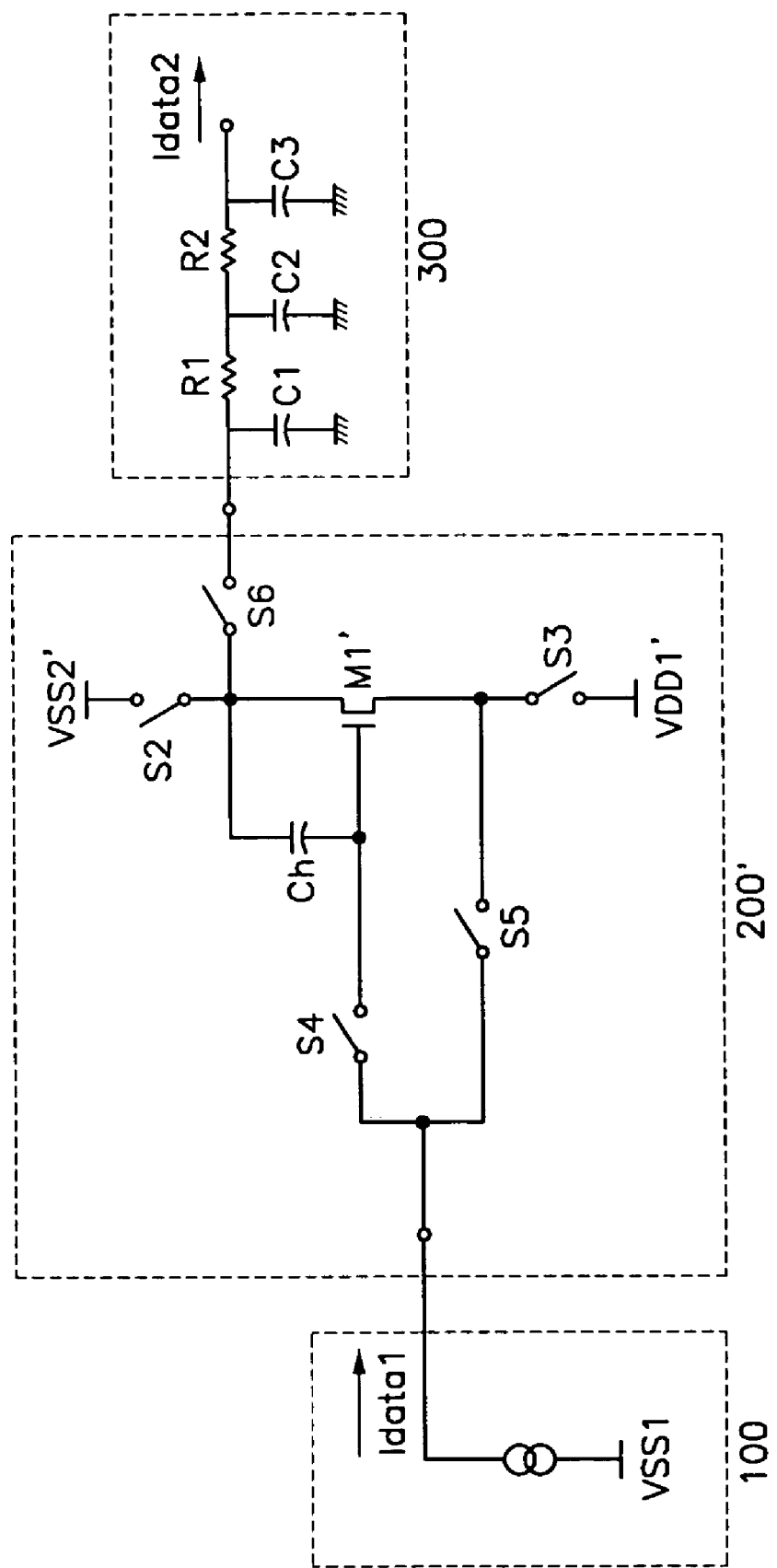
FIG. 5B shows a sample-and-hold circuit which is substantially the same as the sample-and-hold circuit of FIG. 5A, except for having an NMOS transistor M1'.

In addition, as can be seen in FIG. 5B, a sample-and-hold circuit 200' having an input terminal of the current sink type and an output terminal of the current source type can be realized by replacing the transistor M1, which is a PMOS transistor, with a transistor M1', which is an NMOS transistor, and changing the first power source VDD1 and the second power source VSS2, respectively, to a first power source VSS2' and a second power source VDD1'. As those skilled in the art would recognize, the voltage difference between the second power source VDD1' and the first power source VSS2' is substantially the same as that between the first power source VDD1 and the second power source VSS2 of FIG. 5A.

Figure 6:
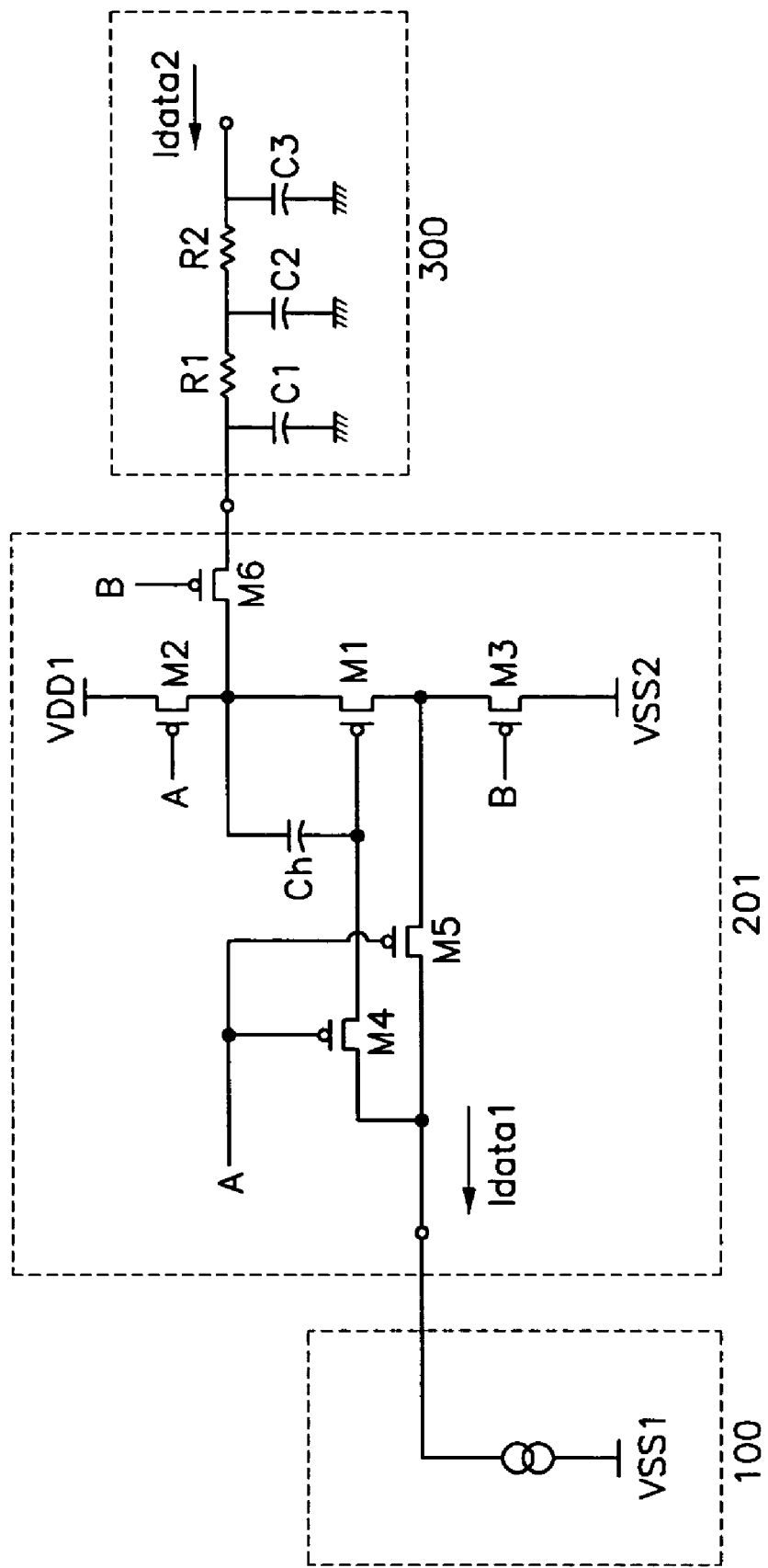
FIG. 6 shows the sample-and-hold circuit of FIG. 5A in which PMOS transistors are used as switches.

FIG. 6 shows a sample-and-hold circuit 201 in which PMOS transistors are used as the switches in the sample-and-hold circuit 200 of FIG. 5A. In other aspects, the sample-and-hold circuit 201 is substantially the same as the sample-and-hold circuit 200 of FIG. 5A.

As shown in FIG. 6, when the transistors M2, M4, and M5 are turned on in response to a control signal A, the sample-and-hold circuit 201 performs the sampling operation on the data. When the transistors M2 to M6 for performing the switching function are turned off, the sample-and-hold circuit 201 stays in the standby mode. When the transistors M3 and M6 are turned on in response to a control signal B, the sample-and-hold circuit holds a substantially constant current which corresponds to the source-gate voltage charged in the capacitor Ch.

Figure 7A:
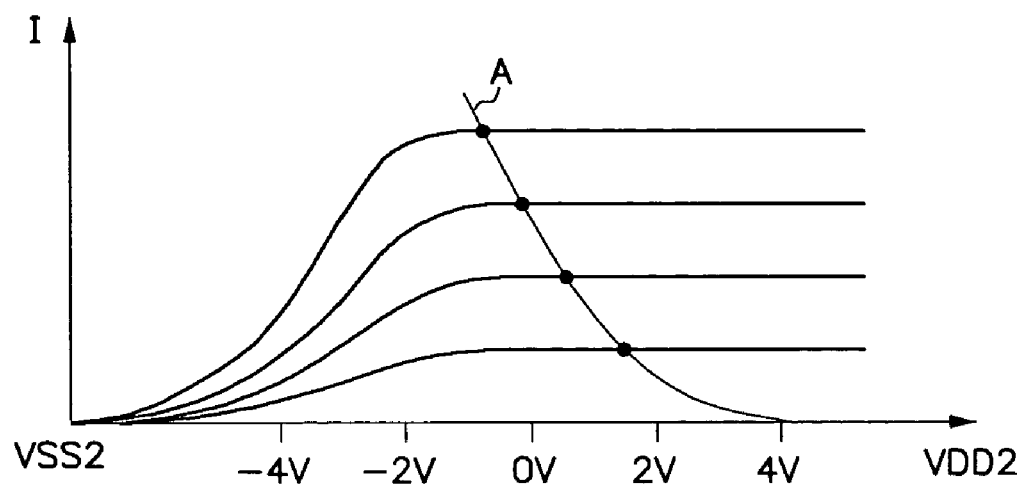
FIGS. 7A and 7B show graphs of operating points in the holding operation when a switch S3 of the sample-and-hold circuit of FIG. 5A is realized with a PMOS transistor and an NMOS transistor, respectively.
Figure 7B:
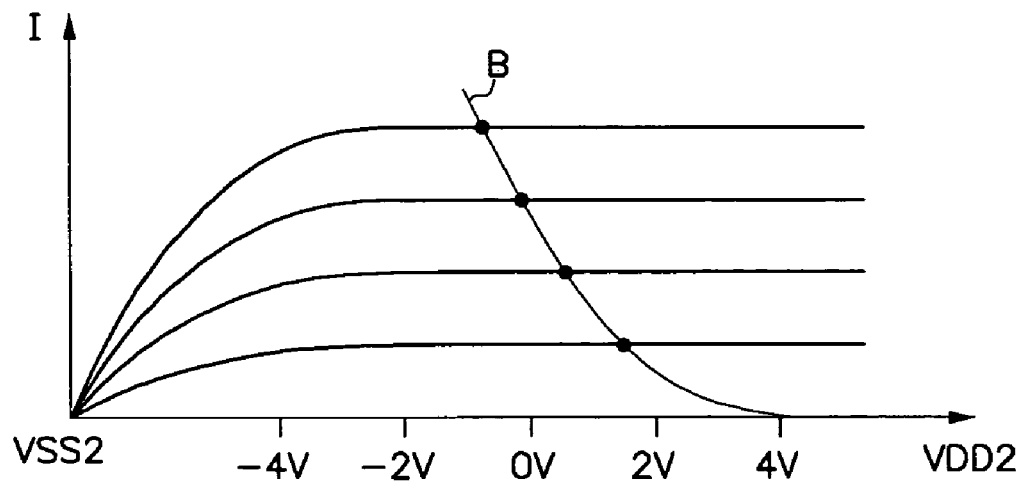

FIGS. 7A and 7B show graphs of operating points in the holding operation when the switch S3 of the sample-and-hold circuit 200 is realized with a PMOS transistor and an NMOS transistor, respectively.

A plurality of characteristic curves which reach the second power source VSS2 in FIGS. 7A and 7B illustrate characteristics of the current and the source voltage of the transistor M1 following the source-gate voltage of the transistor M1. In this instance, the respective characteristic curves correspond to different source-gate voltages. The curves A and B show the characteristic curves of the current which flows from a third power source VDD2 of a pixel through the data line, and the source voltage of the transistor M1. The operating points are determined by crossing points of the characteristic curves and the curves A and B, respectively. The curves A and B are varied according to characteristics of TFTs (thin film transistors) of a pixel circuit, and the operating points must be determined in a saturation region of the characteristic curves so that the output current may not be influenced by inter-pixel TFT characteristic deviations of the pixel circuit caused by a predetermined process.

It can be seen from the operating points shown in FIGS. 7A and 7B that a voltage range of the operating points available at the same current is wider when the switch S3 is realized with an NMOS transistor. When the switch S3 is realized with a PMOS transistor, a drain is coupled to the second power source VSS2, and a voltage level of the second power source VSS2 is used for the gate voltage for turning on the PMOS transistor, and hence, the PMOS transistor is operated as if it is diode-connected during the holding operation of the sample-and-hold circuit. Accordingly, the characteristic curves of FIG. 7A move to voltages with gaps of greater than a threshold voltage of the PMOS transistor at the same current level. Therefore, an available voltage range of the operating points is substantially decreased. On the contrary, when the switch S3 is realized with an NMOS transistor, a source is coupled to the second power source VSS2, and a voltage level of the first power source VDD1 is used for the gate voltage for turning on the NMOS transistor, and hence, the NMOS transistor is operated in the linear region and the drain-source voltage is small. Therefore, the characteristic curves of FIG. 7B move to a little greater voltages at substantially the same current level, and an available voltage range of the operating points is slightly reduced.

Therefore, substantially the uniform outputs are generated in the wider current range when the switch S3 is realized with an NMOS transistor in the sample-and-hold circuit 200.

Figure 8:
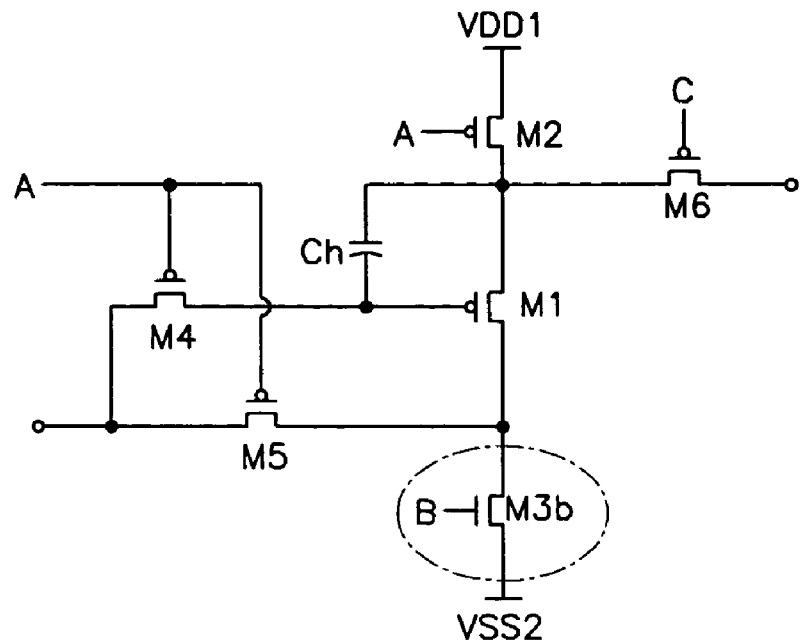
FIG. 8 shows a schematic diagram of the sample-and-hold circuit of FIG. 5 in which an NMOS transistor is used as a switch S3.

FIG. 8 shows a schematic diagram for realizing the switch S3 of the sample-and-hold circuit according to the first exemplary embodiment with an NMOS transistor. Other than the use of the NMOS transistor as the switch S3, the sample-and-hold circuit of FIG. 8 is substantially the same as the sample-and-hold circuit 201 of FIG. 6.

The transistor M6 corresponding to the switch S6 is realized with the PMOS transistor, and the transistor M3b corresponding to the switch S3 is realized with the NMOS transistor. Since channel polarities of the transistors M6 and M3b are different from each other, a control signal B applied to a gate of the transistor M3b and a control signal C applied to a gate of the transistor M6 are different signals. Therefore, the number of control signals is increased.

Figure 9:
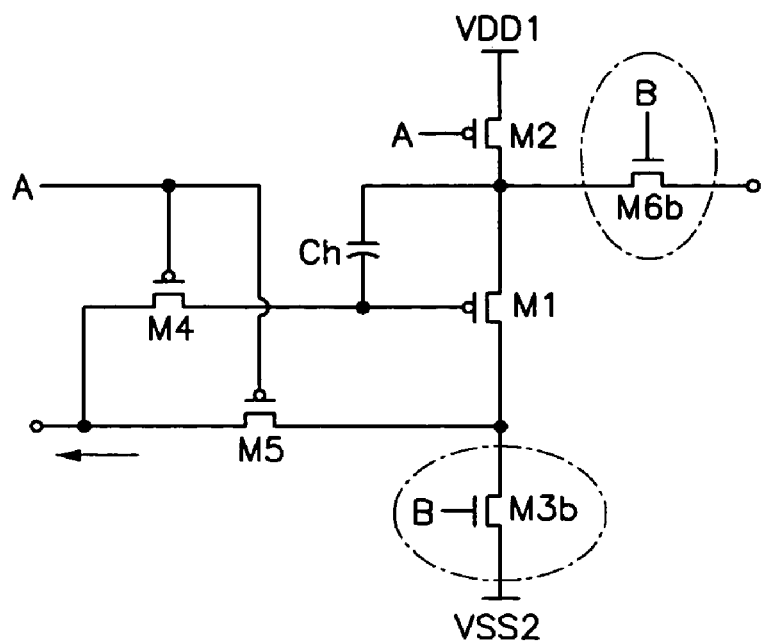
FIG. 9 shows a schematic diagram of the sample-and-hold circuit of FIG. 5 in which NMOS transistors are used as switches S3 and S6.

FIG. 9 shows a schematic diagram for a sample-and-hold circuit in which NMOS transistors are used as the switches S3 and S6. Other than the use of the NMOS transistors as the switches S3 and S6, the sample-and-hold circuit of FIG. 9 is substantially the same as the sample-and-hold circuit 201 of FIG. 6.

In the sample-and-hold circuit of FIG. 9, the switches S2, S4, and S5 are realized with the PMOS transistors M2, M4, and M5, and the switches S3 and S6 are realized with the NMOS transistors M3b and M6b. When the channel polarities of the transistors M3b and M6b are selected to be the same, the number of the signal lines is reduced. Since the channel polarities of the transistors M2, M4, and M5 do not match the channel polarities of the transistors M3b and M6b, the control signals A and B can be the same signal when the circuit of FIG. 9 performs the sampling and holding operations without the standby mode.

Figure 10:
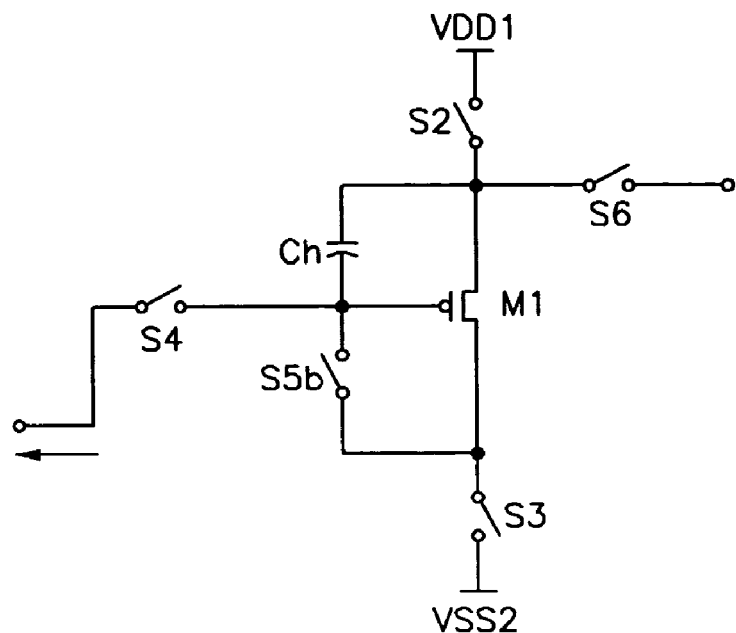
FIG. 10 shows a sample-and-hold circuit according to a second exemplary embodiment of the present invention.

In FIG. 10, differing from the first exemplary embodiment, a switch S5b is coupled between the gate and the drain of the transistor M1. The switches S2, S3, S4, and S6 and the capacitor Ch are coupled in substantially the same manner as those of the first exemplary embodiment of the present invention shown in FIG. 5A. When the switch S5b is turned on, the transistor M1 is diode-connected.

When the switches S2, S4, and S5b are turned on and the switches S3 and S6 are turned off, the gate and the drain of the transistor M1 are coupled to configure a diode connection, and current flows from the first power source VDD1 to the input terminal of the sample-and-hold circuit through the transistor M1. Further, the capacitor Ch is charged with a source-gate voltage which corresponds to the current flowing to the transistor M1, and the sample-and-hold circuit samples the data.

When the switches S2, S3, S4, S5b, and S6 are turned off, the sample-and-hold circuit enters the standby mode. The standby mode is a state where the sample-and-hold circuit waits while another sample-and-hold circuit of the demultiplexer samples data.

When the switches S2, S4, and S5b are turned off and the switches S3 and S6 are turned on, the current which corresponds to the source-gate voltage charged in the capacitor Ch is maintained at the output terminal. In this instance, the sample-and-hold circuit performs a holding operation and outputs data.

In a manner similar to the sample-and-hold circuit 200' of FIG. 5B, the sample-and-hold circuit having an input terminal of the current sink type and an output terminal of the current source type according to the second exemplary embodiment can be realized by replacing the transistor M1 with an NMOS transistor, and changing the relative voltage levels of the first power source VDD1 and the second power source VSS2 with each other.

Also, the circuits having various features can be realized by changing the channel polarities of the transistors used for the switches S2, S3, S4, S5b, and S6.

Figure 11:
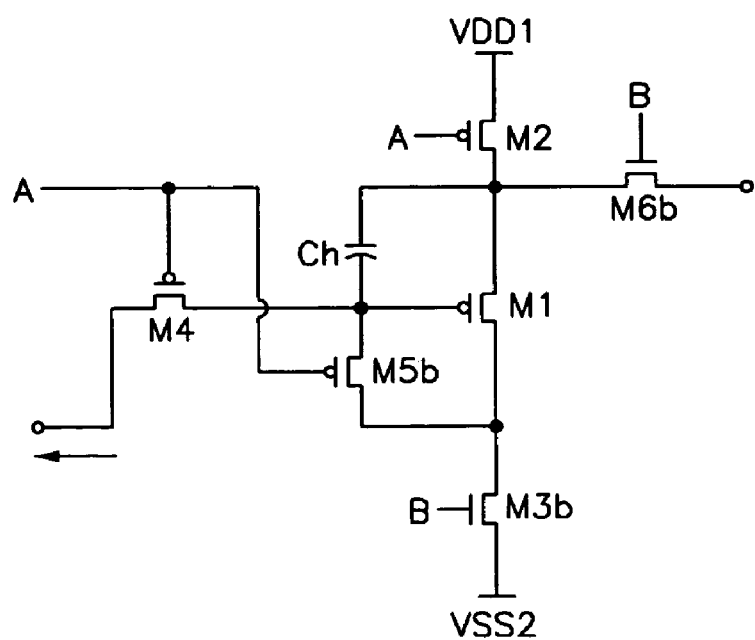
FIG. 11 shows a schematic circuit diagram of the sample-and-hold circuit of FIG. 10 in which NMOS transistors are used as switches S3 and S6.

FIG. 11 shows a schematic circuit diagram for realizing switches S3 and S6 of the sample-and-hold circuit according to the second exemplary embodiment with NMOS transistors.

In the sample-and-hold circuit of FIG. 11, the switches S2, S4, and S5b are realized with the PMOS transistors M2, M4, and M5b, and the switches S3 and S6 are realized with the NMOS transistors M3b and M6b.

Since the channel polarities of the transistors M2, M4, and M5b are different from the channel polarities of the transistors M3b and M6b in the like manner as the exemplary embodiment of FIG. 9, the sample-and-hold circuit can perform operations with the control signals A and B as a single signal in the case of performing the sampling and holding operations without the standby mode.

Also, it is known from the graphs of FIGS. 7A and 7B that the substantially uniform outputs are generated within the wider current range in the case of realizing the transistor M3b with the NMOS transistor as shown in the sample-and-hold circuit of FIG. 11.

Since one end of the capacitor Ch of FIG. 11 is coupled to a source of the transistor M4 and a drain of the transistor M5b, parasitic capacitance may occur in gates of the transistors M4 and M5b. Since the capacitor Ch is coupled to the source of the transistor M4 but not to the drain of the transistor M5 according to the first exemplary embodiment shown in FIG. 5A or FIG. 9, less parasitic capacitance is generated compared to the exemplary embodiment of FIG. 10. Therefore, the first exemplary embodiment may be desirable when considered from the viewpoint of reducing the kickback phenomenon caused by the parasitic capacitance and preventing reduction of the output current.

Channel polarities of the switches S2, S3, S4, S5b, and S6 can be varied in many ways so as to show various circuital features. For example, when the transistors M1 and M6b are realized with transistors of the same channel polarity, the effects caused by the deviation of characteristics of the TFT such as the threshold voltage may be reduced.

Figure 12:
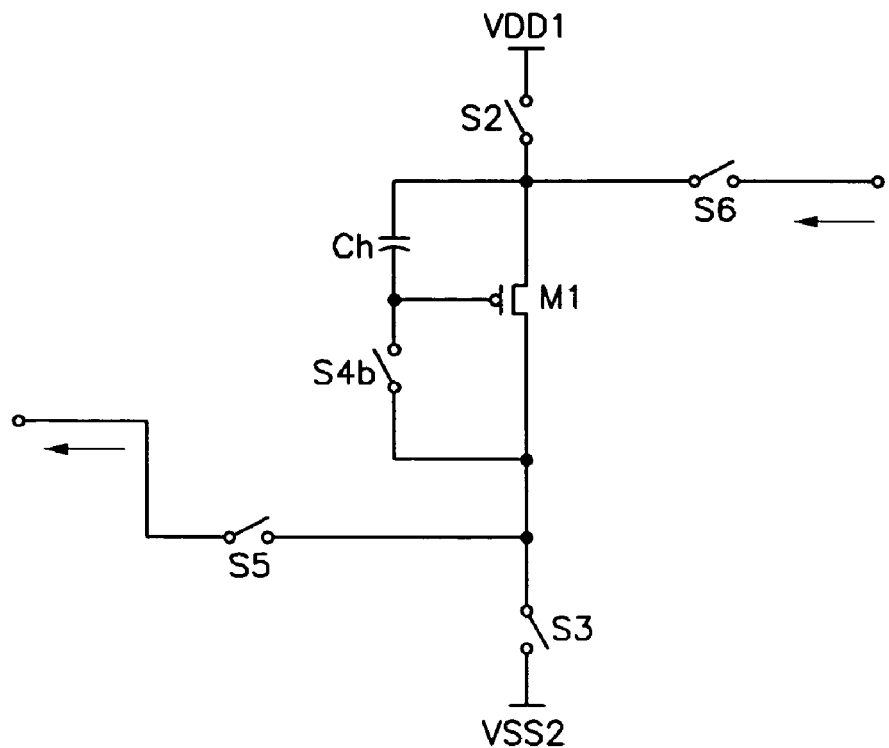
FIG. 12 shows a sample-and-hold circuit according to a third exemplary embodiment of the present invention.

FIG. 12 shows a sample-and-hold circuit according to a third exemplary embodiment of the present invention.

Differing from the first exemplary embodiment, a switch S4b is coupled between the gate and the drain of the transistor M1. The switches S2, S3, S5, and S6 and the capacitor Ch are coupled together in substantially the same configuration as that of the sample-and-hold circuit 200 of FIG. 5A. When the switch S4b is turned on, the transistor M1 is diode-connected.

When the switches S2, S4b, and S5 are turned on and the switches S3 and S6 are turned off, the gate and the drain of the transistor M1 are coupled to configure a diode connection, and current flows from the first power source VDD1 to the input terminal of the sample-and-hold circuit through the transistor M1. Further, the capacitor Ch is charged with a source-gate voltage which corresponds to the current flowing through the transistor M1, and the sample-and-hold circuit samples the data.

When the switches S2, S3, S4b, S5, and S6 are turned off, the sample-and-hold circuit enters the standby mode. The standby mode is a state where the sample-and-hold circuit waits while another sample-and-hold circuit of the demultiplexer samples data.

When the switches S2, S4b, and S5 are turned off and the switches S3 and S6 are turned on, the current which corresponds to the source-gate voltage charged in the capacitor Ch is maintained at the output terminal. In this instance, the sample-and-hold circuit performs a holding operation and outputs data.

In a manner similar to the sample-and-hold circuit 200' of FIG. 5B, the sample-and-hold circuit having an input terminal of the current sink type and an output terminal of the current source type according to the third exemplary embodiment can be realized by replacing the transistor M1 with an NMOS transistor, and changing the relative voltage levels of the first power source VDD1 and the second power source VSS2 with each other.

Also, the circuits having various features can be realized by changing the channel polarities of the transistors used for the switches S2, S3, S4b, S5, and S6.

Figure 13:
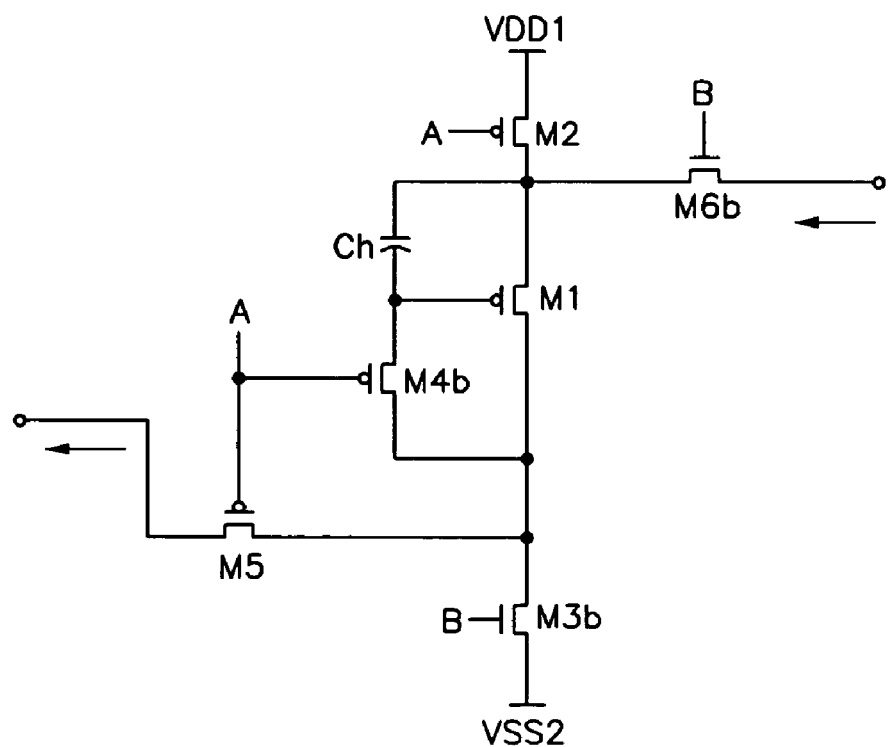
FIG. 13 shows a schematic circuit diagram of the sample-and-hold circuit of FIG. 12 in which NMOS transistors are used as switches S3 and S6.

FIG. 13 shows a schematic circuit diagram for realizing switches S3 and S6 of the sample-and-hold circuit according to the third exemplary embodiment with NMOS transistors.

In the sample-and-hold circuit of FIG. 13, the switches S2, S4b, and S5 are realized with the PMOS transistors, and the switches S3 and S6 are realized with the NMOS transistors.

Since the channel polarities of the transistors M2, M4b, and M5 are different from the channel polarities of the transistors M3b and M6b in a manner similar to the exemplary embodiment of FIG. 9, the sample-and-hold circuit can perform operations with the control signals A and B as a single signal in the case of performing the sampling and holding operations without the standby mode.

Also, it is known from the graphs of FIGS. 7A and 7B that the substantially uniform outputs are generated within the wider current range in the case of realizing the transistor M3b with the NMOS transistor as shown in the sample-and-hold circuit of FIG. 13.

Differing from the second exemplary embodiment, since one end of the capacitor of the sample-and-hold circuit shown in FIG. 13 is coupled to the source of the transistor M4b but not to the drain of the transistor M5, the influence by the parasitic capacitance is less than in the second exemplary embodiment.

Channel polarities of the switches S2, S3, S4b, S5, and S6 can be varied in many ways so as to show various circuital features. For example, when the transistors M1 and M6b are realized with transistors of the same channel polarity, the deviation of characteristics of the TFT such as the threshold voltage is reduced.

As known from the various exemplary embodiments, a person skilled in the art can make a desired sample-and-hold circuit in appropriate consideration of relations between the range of the driving current and the complexity of manufacturing.

That is, the sample-and-hold circuits with various features can be realized by changing the switches and the channel polarities of the transistor M1 according to the first to third exemplary embodiments.

Since the demultiplexer coupled to the data driver is configured with the sample-and-hold circuit, there is no need to reduce the time for writing data on the pixels, thereby realizing a high-resolution display.

Also, since the sample-and-hold circuit has an input terminal of the current source type and an output terminal of the current sink type, the output terminal of the sample-and-hold circuit can be used together with the data driver in the current sink format, and hence, costs are reduced, and the universal usability of the data driver can be achieved.

Further, since the data driver with an output terminal of the current sink lo type can be used, the substantial uniformity of the output current can be achieved.

While this invention has been described in connection with certain exemplary embodiments, it is to be understood that the invention is not limited to the disclosed embodiments, but, on the contrary, is intended to cover various modifications included within the spirit and scope of the appended claims, and equivalents thereof.

What is claimed is:

1. A sample and hold circuit for sampling and holding a current corresponding to data, the circuit comprising:
   a first transistor;
   a first switch coupled to the first transistor and for diode-connecting the first transistor in response to a first control signal applied to the first switch;
   a capacitor coupled to the first transistor and for charging a source-gate voltage of the first transistor therein in response to the first control signal;
   a second switch for inputting the data to a drain of the first transistor in response to the first control signal; and
   a third switch for outputting the data from a source of the first transistor in response to a second control signal utilizing the source-gate voltage charged in the capacitor.

2. The sample and hold circuit of claim 1, further comprising:
   a fourth switch for coupling the source of the first transistor to a first power source in response to a third control signal; and
   a fifth switch for coupling the drain of the first transistor to a second power source in response to a fourth control signal.

3. The sample and hold circuit of claim 2, wherein the first transistor is a PMOS transistor, and the first power source has a voltage higher than that of the second power source.

4. The sample and hold circuit of claim 2, wherein the first transistor is an NMOS transistor, and the first power source has a voltage lower than that of the second power source.

5. The sample and hold circuit of claim 2, wherein the first, second, and fourth switches have the same channel polarity, and the third and fifth switches have the same channel polarity.

6. The sample and hold circuit of claim 2, wherein the fourth switch is a transistor having the same channel polarity as that of the first transistor, and the fifth switch is a transistor having a channel polarity different from the channel polarity of the first transistor.

7. The sample and hold circuit of claim 6, wherein the third switch is a transistor having the same channel polarity as that of the fourth switch.

8. The sample and hold circuit of claim 6, wherein the first and second switches are transistors having the same channel polarity as that of the fifth switch.

9. The sample and hold circuit of claim 6, wherein the third switch is a transistor having a channel polarity different from the channel polarity of the fifth switch.

10. The sample and hold circuit of claim 5, wherein one signal is used as both the third control signal and the first control signal, and another signal is used as both the fourth control signal and the second control signal.

11. The sample and hold circuit of claim 10, wherein the channel polarities of the first, second, and fourth switches are different from the channel polarities of the third and fifth switches.

12. The sample and hold circuit of claim 10, wherein the first control signal and the second control signal have different values for a predetermined period.

13. A method for sampling and holding a current, comprising:
(a) diode-connecting a first transistor, and allowing an input current to flow to a first power source from a drain of the first transistor through the first transistor;
(b) charging a source-gate voltage which corresponds to the input current in a capacitor coupled between a source and a gate of the first transistor; and
(c) allowing an output current which corresponds to the source-gate voltage charged in the capacitor to flow to the source of the first transistor from a second power source through the first transistor.

14. A method for sampling and holding a current, comprising:
(a) diode-connecting a first transistor, and allowing an input current to flow to a drain of the first transistor from a first power source though the first transistor;
(b) charging a source-gate voltage which corresponds to the input current in a capacitor coupled between a source and a gate of the first transistor; and
(c) allowing an output current which corresponds to the source-gate voltage charged in the capacitor to flow to a second power source from the source of the first transistor through the first transistor.

* * * * *